United States Patent
Kim et al.

(10) Patent No.: US 8,416,632 B2
(45) Date of Patent: Apr. 9, 2013

(54) BITLINE PRECHARGE VOLTAGE GENERATOR, SEMICONDUCTOR MEMORY DEVICE COMPRISING SAME, AND METHOD OF TRIMMING BITLINE PRECHARGE VOLTAGE

(75) Inventors: Ki-Heung Kim, Suwon-si (KR);
Seong-Jin Jang, Seongnam-si (KR);
Myeong-O Kim, Suwon-si (KR);
Hong-Jun Lee, Suwon-si (KR);
Tae-Yoon Lee, Busan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 261 days.

(21) Appl. No.: 12/904,302

(22) Filed: Oct. 14, 2010

(65) Prior Publication Data
US 2011/0122711 A1 May 26, 2011

(30) Foreign Application Priority Data
Nov. 24, 2009 (KR) .................. 10-2009-0113664

(51) Int. Cl.
*G11C 5/14* (2006.01)

(52) U.S. Cl.
USPC .............. 365/189.09; 365/203; 365/207

(58) Field of Classification Search ............ 365/203, 365/222, 205, 230.06, 230.08, 189.11
See application file for complete search history.

(56) References Cited

U.S. PATENT DOCUMENTS
| | | | |
|---|---|---|---|
| 6,198,682 B1 * | 3/2001 | Proebsting ................ 365/207 |
| 6,504,766 B1 * | 1/2003 | Pilo et al. ................ 365/189.14 |
| 6,707,139 B2 * | 3/2004 | Fujii et al. ................ 257/678 |
| 7,810,970 B2 * | 10/2010 | Ishiguro .................. 362/466 |

FOREIGN PATENT DOCUMENTS
| | | |
|---|---|---|
| JP | 09035480 A | 2/1997 |
| JP | 2000090669 A | 3/2000 |
| JP | 2002124085 B2 | 4/2002 |

* cited by examiner

*Primary Examiner* — Gene Auduong
(74) *Attorney, Agent, or Firm* — Volentine & Whitt, PLLC

(57) ABSTRACT

A bitline precharge voltage generator comprises a leakage trimming unit and a bitline precharge voltage providing unit. The leakage trimming unit applies a leakage current to an output node to place a bitline precharge voltage at an edge of a dead zone. The bitline precharge voltage providing unit provides the bitline precharge voltage to the output node, and sets the bitline precharge voltage to a target level. The bitline precharge voltage generator generates the bitline precharge voltage having a distribution including the dead zone.

19 Claims, 10 Drawing Sheets

210

220

BITLINE PRECHARGE VOLTAGE GENERATOR, SEMICONDUCTOR MEMORY DEVICE COMPRISING SAME, AND METHOD OF TRIMMING BITLINE PRECHARGE VOLTAGE

CROSS-REFERENCE TO RELATED APPLICATIONS

This application claims priority under 35 USC §119 to Korean Patent Application No. 10-2009-0113664 filed on Nov. 24, 2009, the disclosure of which is hereby incorporated by reference in its entirety.

BACKGROUND

Embodiments of the inventive concept relate generally to electronic memory technologies. More particularly, embodiments of the inventive concept relate to bitline precharge voltage generators and semiconductor memory devices comprising bitline precharge voltage generators.

Dynamic random access memory (DRAM) is a form of volatile memory that stores data using capacitors. In a DRAM, each memory cell comprises a storage capacitor that can store charges corresponding to a logical "0" or a logical "1", and an access transistor that controls access to the storage capacitor. The access transistor typically has a gate connected to a wordline, and a channel connected between a bitline and the storage capacitor.

The storage capacitor tends to leak charges, so the memory cell must be refreshed periodically to retain stored data. The memory cell is typically refreshed by reading data from the storage capacitor and rewriting the data in the storage capacitor. To read the data from the storage capacitor, a bitline precharge circuit precharges the bitline before a voltage is applied to the wordline to turn on the access transistor. Once the access transistor is turned on, a bitline sensing circuit senses a voltage change on the precharged bitline to detect data stored in the storage capacitor. Thereafter, the memory cell is refreshed by applying charges to the storage capacitor based on the detected data.

To accurately detect the data stored in the storage capacitor, the bitline must be precharged with a stable voltage. However, in high speed DRAM devices, it can be difficult to achieve a stable bitline precharge voltage.

SUMMARY

Some embodiments of the inventive concept provide a bitline precharge voltage generator that is capable of generating a stable bitline precharge voltage. Some embodiments provide a memory device comprising such a bitline precharge voltage generator. Some embodiments provide a method of trimming a bitline precharge voltage. Some embodiments provide a method of reducing a deviation of bitline precharge voltages of a plurality of dies at a wafer level.

According to one embodiment of the inventive concept, a bitline precharge voltage generator comprises a bitline precharge voltage providing unit configured to output a bitline precharge voltage to an output node and further configured to set the bitline precharge voltage to a target level, and a leakage trimming unit configured to apply a leakage current to the output node to place the bitline precharge voltage at an edge of a dead zone.

In certain embodiments, the bitline precharge voltage providing unit comprises a voltage dividing unit that outputs a first reference voltage through a first node and outputs a second reference voltage through a second node, wherein the first node and the second node are located between a third node connected to a first supply voltage and a fourth node connected to ground, the voltage dividing unit comprising a plurality of resistors. The bitline precharge voltage providing unit further comprises an amplifying unit configured to output a first driving control signal, and a second driving control signal based on the first reference voltage, the second reference voltage, and the bitline precharge voltage, a driving unit configured to drive the output node to the bitline precharge voltage in response to the first driving control signal and the second driving control signal, and a fuse unit connected to the voltage dividing unit and configured to set the bitline precharge voltage to the target level by adjusting the first reference voltage and the second reference voltage using a plurality of fuses.

In certain embodiments, the amplifying unit comprises a first amplifier connected between a second supply voltage and ground, and configured to amplify a voltage difference between the second reference voltage and the bitline precharge voltage to generate the first driving control signal, and a second amplifier connected between the second supply voltage and ground, and configured to amplify a voltage difference between the first reference voltage and the bitline precharge voltage to generate the second driving control signal.

In certain embodiments, the driving unit comprises a first transistor connected between the second supply voltage and the output node, and configured to pull up the output node in response to the first driving control signal, and a second transistor connected between the second supply voltage and the output node, and configured to pull down the output node in response to the second driving control signal.

In certain embodiments, wherein the leakage trimming unit comprises at least one leakage element configured to apply the leakage current to the output node in response to at least one leakage control signal In certain embodiments, the at least one leakage control signal comprises a first leakage control signal and a second leakage control signal, and wherein the leakage trimming unit comprises a first leakage element connected between a third supply voltage and a leakage node coupled to the output node, and configured to apply a positive leakage current to the output node in response to the first leakage control signal, and a second leakage element connected between the ground voltage and the leakage node, and configured to apply a negative leakage current to the output node in response to the second leakage control signal.

In certain embodiments, the leakage trimming unit comprises a leakage element connected between a third supply voltage and a leakage node coupled to the output node, and configured to apply a positive leakage current to the output node in response to the at least one leakage control signal In certain embodiments, the leakage trimming unit comprises a leakage element connected between the ground voltage and a leakage node coupled to the output node, and configured to apply a negative leakage current to the output node in response to the at least one leakage control signal.

In certain embodiments, the bitline precharge voltage generator further comprises a monitoring unit coupled to the output node, and configured to monitor the level of the bitline precharge voltage.

In certain embodiments, the monitoring unit determines whether the monitored bitline precharge voltage is in the dead zone, and selectively activates or deactivates the leakage trimming unit based on the determination.

According to another embodiment of the inventive concept, a memory device comprises a memory core configured to precharge a bitline and a complementary bitline according to a bitline precharge voltage, and configured to amplify a voltage difference between the bitline and the complementary bitline and apply the amplified voltage difference to a local input/output (I/O) line pair, a local sense amplifier configured to amplify voltage signals of the local I/O line pair and apply the amplified voltage signals to a global I/O line pair, an I/O sense amplifier configured to amplify voltage signals of the global I/O line pair, an I/O buffer configured to buffer input data and an output signal of the I/O sense amplifier and to output the buffered output signal, and a voltage generator comprising a bitline precharge voltage generator configured to generate the bitline precharge voltage.

In certain embodiments, a distribution of the bitline precharge voltage has a dead zone, and the bitline precharge voltage generator comprises a leakage trimming unit configured to apply a leakage current to an output node to place the bitline precharge voltage at an edge of the dead zone, wherein the bitline precharge voltage is apparent on the output node, and a bitline precharge voltage providing unit configured to output the bitline precharge voltage and to set the bitline precharge voltage to a target level.

In certain embodiments, the memory core comprises a first memory cell coupled to the bitline, a second memory cell coupled to the complementary bitline, an equalizer configured to precharge the bitline and the complementary bitline according to the bitline precharge voltage, a bitline sense amplifier configured to amplify the voltage difference between the bitline and the complementary bitline, and a column selection circuit configured to electrically connect each of the bitline and the complementary bitline to the local I/O line pair in response to a column selection signal.

In certain embodiments, the memory core comprises dynamic random access memory cells.

In certain embodiments, the bitline precharge voltage providing unit comprises a voltage dividing unit that outputs a first reference voltage through a first node and outputs a second reference voltage through a second node, wherein the first node and the second node are located between a third node connected to a first supply voltage, and a fourth node connected to ground, the voltage dividing unit comprising a plurality of resistors, an amplifying unit configured to output a first driving control signal and a second driving control signal based on the first reference voltage, the second reference voltage, and the bitline precharge voltage, a driving unit configured to drive the output node to the bitline precharge voltage in response to the first driving control signal and the second driving control signal, and a fuse unit connected to the voltage dividing unit and configured to set the bitline precharge voltage to the target level by adjusting the first reference voltage and the second reference voltage using a plurality of fuses.

According to an embodiment of the inventive concept, method is provided for trimming a bitline precharge voltage that is used to precharge a bitline and a complementary bitline. The method comprises measuring a level of the bitline precharge voltage, determining whether the bitline precharge voltage is in a dead zone, based on a distribution of the measured level, and setting the bitline precharge voltage to a target voltage using a leakage current based on the determination.

In certain embodiments, where the measured level is determined to be out of the dead zone of the bitline precharge voltage, setting the bitline precharge voltage comprises setting the bitline precharge voltage to the target voltage using a plurality of fuses.

In certain embodiments, where the measured level is in the dead zone of the bitline precharge voltage, setting the bitline precharge voltage comprises placing the bitline precharge voltage near an edge of the dead zone using the leakage current, and setting the bitline precharge voltage to the target voltage level.

In certain embodiments, setting the bitline precharge voltage to the target voltage using a plurality of fuses comprises selectively cutting the fuses.

In certain embodiments, the fuses are laser fuses or electrical fuses.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, third, etc. are used to describe various elements; however, the described elements should not be limited by these terms. Rather, these terms are used to distinguish one element from another. Thus, a first element could be termed a second element without departing from the teachings of the inventive concept. In addition, the term "and/or" includes any and all combinations of one or more of the associated listed items.

Where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments only and is not intended to be limiting of the inventive concept. The singular forms "a," "an" and "the" are intended to include plural forms as well, unless the context clearly indicates otherwise. The terms "comprises," "comprising," "includes," and/or "including," where used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense unless expressly so defined herein.

Figure 1:
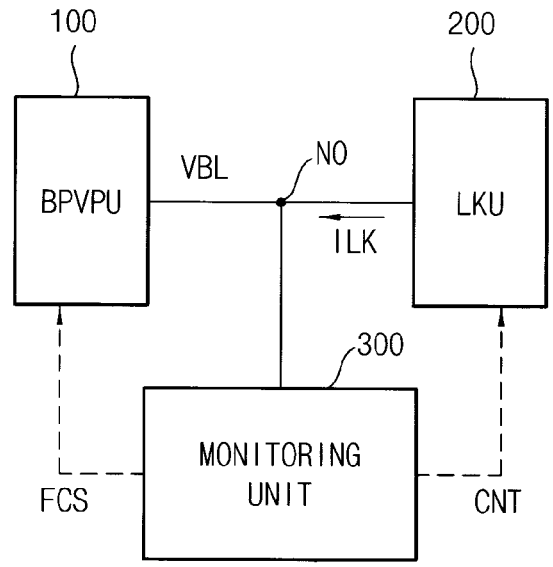
FIG. 1 is a block diagram illustrating a bitline precharge voltage generator having a dead zone according to an embodiment of the inventive concept.

FIG. 1 is a block diagram illustrating a bitline precharge voltage (VBL) generator having a dead zone according to an embodiment of the inventive concept.

Referring to FIG. 1, a bitline precharge voltage generator 10 comprises a leakage trimming unit (LKU) 200, a bitline precharge voltage providing unit (BPVPU) 100, and a monitoring unit 300.

Leakage trimming unit 200 applies a leakage current ILK to an output node NO to place a level of a bitline precharge voltage VBL at an edge of a dead zone. Bitline precharge voltage providing unit 100 provides bitline precharge voltage VBL to output node NO, and sets bitline precharge voltage VBL to a target level. Leakage trimming unit 200 will be described below with reference to FIGS. 4A, 4B and 4C.

Figure 2:
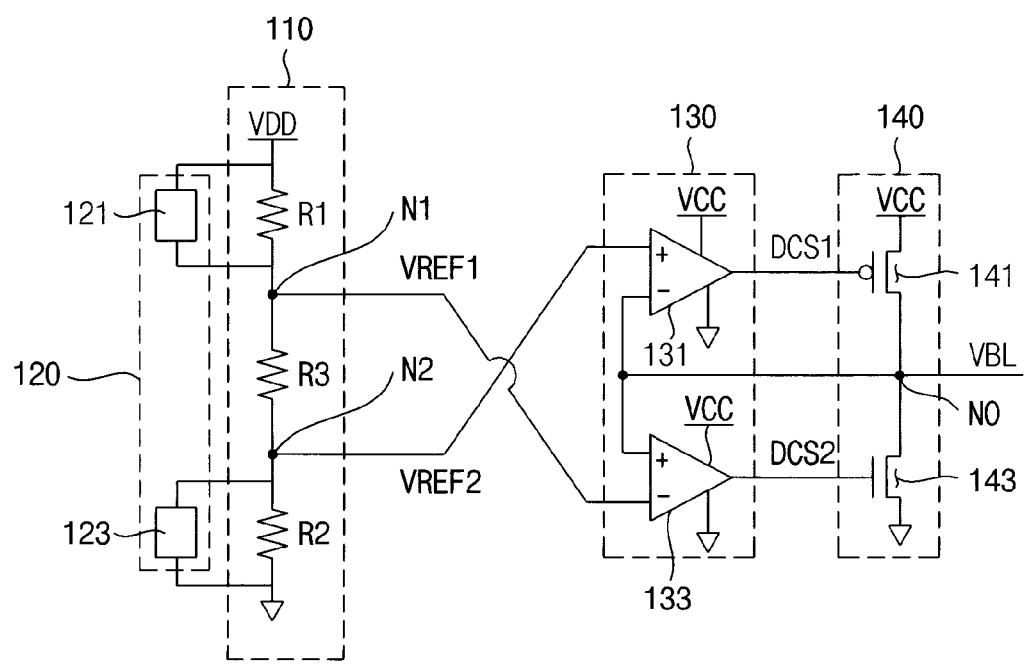
FIG. 2 is a circuit diagram illustrating an example of a bitline precharge voltage providing unit in the bitline precharge voltage generator of FIG. 1.

FIG. 2 is a circuit diagram illustrating an example of bitline precharge voltage providing unit 100 in bitline precharge voltage generator 10 of FIG. 1.

Referring to FIG. 2, bitline precharge voltage providing unit 100 comprises a voltage dividing unit 110, an amplifying unit 130, a driving unit 140, and a fuse unit 120.

Voltage dividing unit 110 comprises a plurality of resistors R1, R2 and R3 that are connected in series between a first supply voltage VDD, an internal supply voltage, and ground. Voltage dividing unit 110 outputs a first reference voltage VREF1 through a first node N1 located between resistors R1 and R3, and outputs a second reference voltage VREF2 through a second node N2 located between resistors R2 and R3, where the level of first reference voltage VREF1 is higher than the level of second reference voltage VREF2. In some embodiments, first supply voltage VDD is a driving voltage of a memory core.

Amplifying unit 130 provides a first driving control signal DCS1 and a second driving control signal DCS2 based on first reference voltage VREF1, second reference voltage VREF2, and bitline precharge voltage VBL. Amplifying unit 130 comprises a first amplifier 131 and a second amplifier 133, which are differential amplifiers. First amplifier 131 amplifies a voltage difference between second reference voltage VREF2 and bitline precharge voltage VBL to generate first driving control signal DCS1. Second amplifier 133 amplifies a voltage difference between first reference voltage VREF1 and bitline precharge voltage VBL to generate second driving control signal DCS2. First amplifier 131 and second amplifier 133 are coupled between a second supply voltage VCC and ground.

Driving unit 140 drives output node NO to bitline precharge voltage VBL in response to first driving control signal DCS1 and second driving control signal DCS2. Driving unit 140 comprises a first transistor 141 and a second transistor 143. First transistor 141, which is coupled between second supply voltage VCC and output node NO, receives first driving control signal DCS1. Second transistor 143, which is coupled between second supply voltage VCC and output node NO, receives second driving control signal DCS2. First transistor 141 is a P-type metal oxide semiconductor (PMOS) transistor, and second transistor 143 is an N-type metal oxide semiconductor (NMOS) transistor. First transistor 141 pulls up output node NO in response to first driving control signal DCS1. Second transistor 143 pulls down output node NO in response to second driving control signal DSC2.

Fuse unit 120 is coupled to voltage dividing unit 110 and sets bitline precharge voltage VBL, which is at the edge of the dead zone, to the target level by adjusting first reference voltage VREF1 and second reference voltage VREF2 using a plurality of fuses. Fuse unit 120 will be described below with reference to FIG. 3.

Bitline precharge voltage VBL has a dead zone (for example, 411 in FIG. 5) because bitline precharge voltage generator 100 comprises first differential amplifier 131, second differential amplifier 133, first transistor 141, and second transistor 143. Where bitline precharge voltage VBL is in the dead zone, both first transistor 141 and second transistor 143 are turned off at the same time. As a result, bitline precharge voltage VBL can be meta-stable, and thus bitline precharge voltage VBL can have a distribution with a relatively large deviation.

Where bitline precharge voltage VBL having such a distribution is applied to a bitline or a complementary bitline of a memory device, the sensing performance of a corresponding sense amplifier for detecting a logic high signal or a logic low signal can deteriorate because shared charges of either side of output node NO that are for driving the bitline and complementary bitline are reduced. The logic high signal typically represents data "1" and the logic low signal represents data "0". In certain embodiments, bitline precharge voltage VBL is placed near the edge of the dead zone by applying leakage current ILK to output node NO, which provides bitline precharge voltage VBL to external circuits or devices to prevent the deterioration in the sensing performance. Then, bitline precharge voltage VBL at the edge of the dead zone is adjusted to a target voltage level, such as half of first supply voltage VDD, by adjusting first reference voltage VREF1 and second reference voltage VREF2 using the fuses in fuse unit 120.

Figure 3:
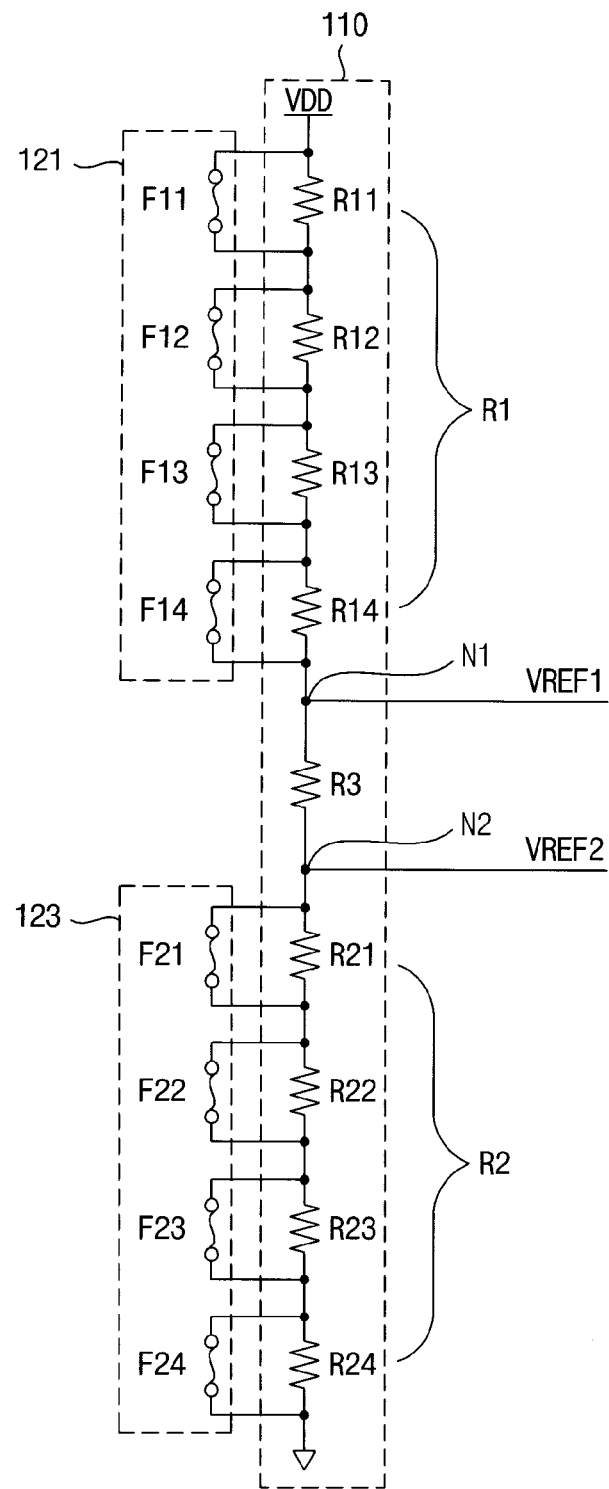
FIG. 3 illustrates an example of a voltage dividing unit and a fuse unit in the bitline precharge voltage providing unit of FIG. 2.

FIG. 3 illustrates an example of voltage dividing unit 110 and fuse unit 120 in the bitline precharge voltage providing unit of FIG. 2.

Referring to FIG. 3, voltage dividing unit 110 comprises first resistors R11, R12, R13, R14, second resistors R21, R22, R23, R24, and a third resistor R3. In this embodiment, resistor R1 of FIG. 2 comprises first resistors R11 through R14, and resistor R2 of FIG. 2 comprises second resistors R21 through R24. First resistors R11 through R14 are coupled between first supply voltage VDD and first node N1, and second resistors R21 through R24 are coupled between second node N2 and ground. Third resistor R3 is coupled between first node N1 and second node N2.

Fuse unit 120 comprises a first fuse block 121 and a second fuse block 123. First fuse block 121 comprises first fuses F11, F12, F13 and F14 that are coupled in parallel to first resistors R11 through R14, respectively. Second fuse block 123 comprises first fuses F21, F22, F23 and F24 that are coupled in parallel to second resistors R21 through R24, respectively. First reference voltage VREF1 is varied based on whether each of first fuses F11 through F14 is cut, and second voltage VREF2 is varied based on whether each of second fuses F21 through F24 is cut.

Fuse unit 120 is coupled to voltage dividing unit 110 and sets bitline precharge voltage VBL to the target level by adjusting first reference voltage VREF1 and second reference voltage VREF2 using a plurality of fuses. Thus, levels of first reference voltage VREF1 and second reference voltage VREF2 are controlled by cutting or fusing the first and second resistors, and bitline precharge voltage VBL is set to a target voltage, for example, VDD/2 by controlling first reference voltage VREF1 and second reference voltage VREF2.

First fuses F11 through F14 and second fuses F21 through F24 can comprise, for instance, laser fuses or electrical fuses (E-fuse). Where first fuses F11 through F14 and second fuses F21 through F24 are laser fuses, bitline precharge voltage VBL can be adjusted at a wafer level. Alternatively, where first fuses F11 through F14 and second fuses F21 through F24 are electrical fuses, bitline precharge voltage VBL can be adjusted at a wafer level and at a package level. In some embodiments, first fuses F11 through F14 and second fuses F21 through F24 are electrical fuses comprising switches that are controlled by a switch control signal (not shown). In such embodiments, adjust bitline precharge voltage VBL can be adjusted by opening or closing the switches.

Figure 4A:
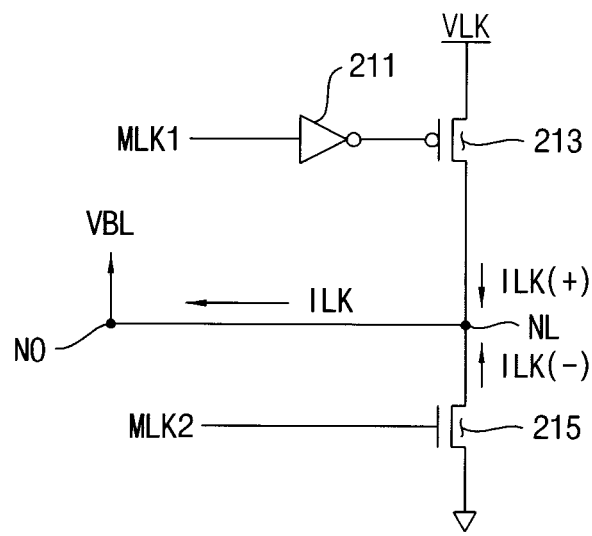
FIGS. 4A, 4B and 4C illustrate an example of a leakage trimming unit in the bitline precharge voltage generator of FIG. 1.
Figure 4B:
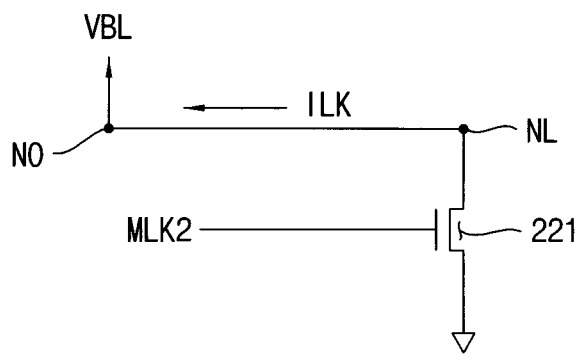
Figure 4C:
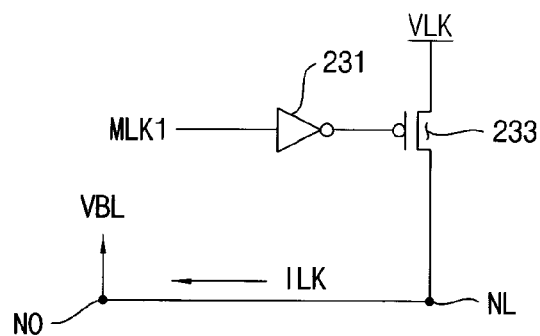

FIGS. 4A, 4B and 4C illustrate an example of leakage trimming unit 200 in bitline precharge voltage generator 10 of FIG. 1.

Referring to FIG. 4A, a leakage trimming unit 210 comprises at least one leakage element that applies leakage current ILK to output node NO in response to at least one leakage control signal. Leakage trimming unit 210 comprises an inverter 211, a first leakage element 213, and a second leakage element 215.

First leakage element 213 is coupled between a third supply voltage VLK and a leakage node NL coupled to output node NO. First leakage element 213 applies a positive leakage current ILK (+) to output node NO in response to a first leakage control signal MLK1. Second leakage element 215 is coupled between ground and leakage node NL. Second leakage element 215 applies a negative leakage current ILK (−) to output node NO in response to a second leakage control signal MLK2. In this case, leakage current ILK is a sum of positive leakage current ILK (+) and negative leakage current ILK (−). In the example of FIG. 4A, first leakage element 213 is a PMOS transistor, and second leakage element 215 is an NMOS transistor.

Referring to FIG. 4B, leakage trimming unit 220 comprises a leakage element 221. Leakage element 221 is coupled between ground and a leakage node NL, which is coupled to output node NO. Leakage element 221 applies a negative leakage current ILK to output node NO in response to leakage control signal MLK2. In the example of FIG. 4B, leakage element 221 comprises an NMOS transistor.

Referring to FIG. 4C, leakage trimming unit 230 comprises an inverter 231 and a leakage element 233. Leakage element 233 is coupled between third supply voltage VLK and leakage node NL, which is coupled to output node NO, and applies a positive leakage current ILK to output node NO in response to a leakage control signal MLK1. In the example of FIG. 4C, leakage element 233 may be a PMOS transistor.

In the embodiments of FIGS. 4A, 4B and 4C, leakage elements 213, 215, 221 and 233 of FIGS. 4A, 4B and 4C each comprise a transistor. In other embodiments, the leakage elements can comprise resistors or fuses for applying a leakage current to output node NO. In still other embodiments, each of the leakage elements comprises a diode. Leakage control signals MLK1 and MLK2 can be combination signals in which a test mode register set (MRS) and fuse information of fuse unit 120 of FIG. 2 are combined.

Figure 5:
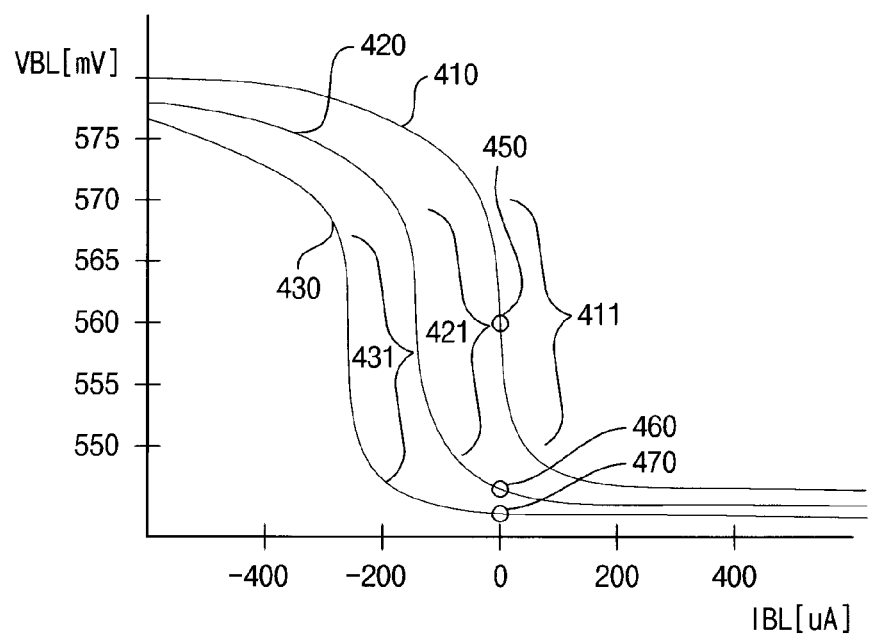
FIG. 5 is a graph illustrating changes in a bitline precharge voltage based on an amount of leakage current according to an embodiment of the inventive concept.

FIG. 5 is a graph illustrating changes in bitline precharge voltage VBL based on an amount of leakage current according to an example embodiment.

In FIG. 5, a reference number 410 indicates changes of bitline precharge voltage VBL where leakage current ILK is not applied to output node NO by leakage trimming unit 200 of FIG. 1, and a reference number 420 indicates changes of bitline precharge voltage VBL where leakage current ILK is applied to output node NO by leakage trimming unit 200 of FIG. 1. A reference number 430 indicates level changes of bitline precharge voltage VBL where a leakage current with a relatively higher current level than leakage current ILK of reference number 420 is applied to output node NO by leakage trimming unit 200 of FIG. 1. Reference numbers 411, 421 and 431 indicate dead zones of bitline precharge voltages VBL corresponding to respective reference numbers 410, 420 and 430.

Referring to FIG. 5, where leakage current ILK is applied to output node NO, bitline precharge voltage VBL moves from a reference number 450 to reference number 460 or 470. Accordingly, bitline precharge voltage VBL is placed on an edge of dead zone 411, 421 or 431. Such shifts of dead zone 411 of bitline precharge voltage VBL in response to leakage current ILK lead to movements of bitline precharge voltage VBL within dead zone 411. Thus, in some embodiments, bitline precharge voltage VBL is placed on either side of edge of dead zone 411 by applying the positive or negative leakage current ILK to output node NO.

Referring again to FIG. 1, bitline precharge voltage generator 10 further comprises monitoring unit 300 to monitor the level of bitline precharge voltage VBL of output node NO. Where the monitored level is in the dead zone of bitline precharge voltage VBL, monitoring unit 300 provides a control signal CNT to leakage trimming unit 200 so that leakage trimming 200 is activated to apply leakage current ILK to output node NO based on control signal CNT. Then, after bitline precharge voltage VBL is transferred to an edge of the dead zone by applying the leakage to output node NO, monitoring unit 300 provides a fuse control signal FCS to bitline precharge voltage providing unit 100 to control levels of first reference voltage VREF1 and second reference voltage VREF2. Where the monitored level is out of the dead zone of bitline precharge voltage VBL, monitoring unit 300 deactivates leakage trimming unit 200 using control signal CNT so that leakage current ILK is not applied to output node NO. Thus, monitoring unit 300 determines whether the monitored bitline precharge voltage is in the dead zone, and selectively activates or deactivates leakage trimming unit 200 based on the determination.

Figure 6:
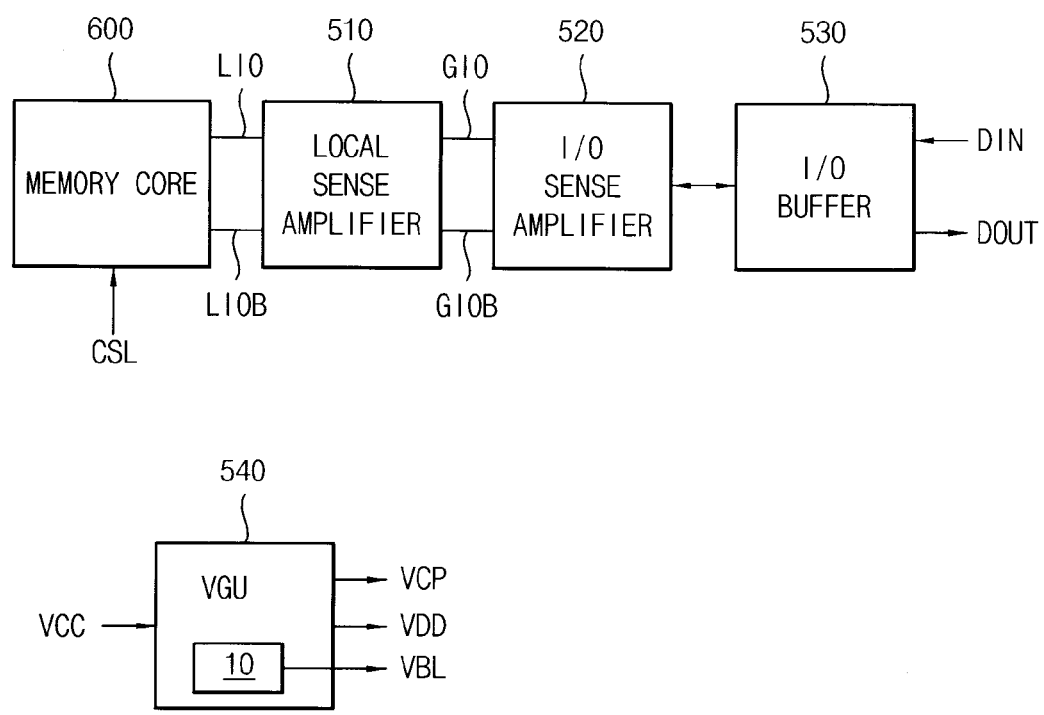
FIG. 6 is a block diagram illustrating a memory device according to an embodiment of the inventive concept.

FIG. 6 is a block diagram illustrating a memory device 500 according to an embodiment of the inventive concept.

Referring to FIG. 6, memory device 500 comprises a memory core 600, a local sense amplifier 510, an I/O sense amplifier 520, an I/O buffer 530, and a bitline precharge voltage generator 540.

Memory core 600 precharges a bitline BL and a complementary bitline BLB to bitline precharge voltage VBL, amplifies a voltage difference between bitline BL and complementary bitline BLB, and applies the amplified voltage difference to a local I/O line pair LIO and LIOB. Local sense amplifier 510 amplifies voltage signals of local I/O line pair LIO and LIOB, and applies the amplified voltage signals to a global I/O line pair GIO and GIOB. I/O sense amplifier 520 amplifies voltage signals of the global I/O line pair GIO and GIOB. I/O buffer 530 buffers input data DIN to be transmitted to the I/O sense amplifier 520, buffers an output signal of the I/O sense amplifier 520 and provides the buffered output signal of I/O sense amplifier 520 to external circuitry of memory device 500 through an output pad (not shown). Voltage generator 540 generates various voltages VCP, VDD and VBL based on a supply voltage VCC. The various voltages VCP, VDD and VBL represent a cell plate voltage, a memory core voltage and a bitline precharge voltage. Voltage generator 540 comprises bitline precharge voltage generator 10 of FIG. 1 that generates bitline precharge voltage VBL.

Figure 7:
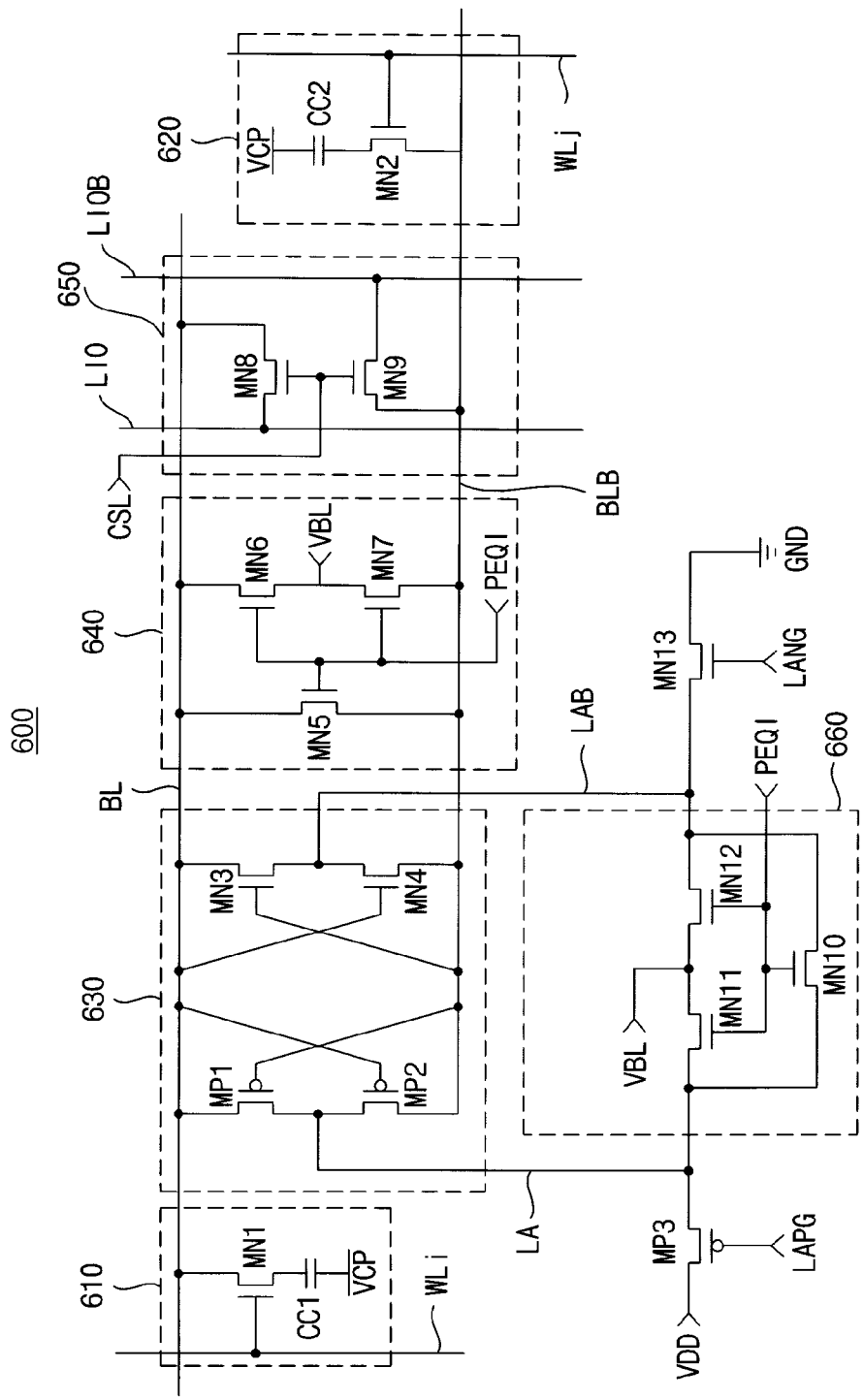
FIG. 7 is a circuit diagram illustrating an example of a memory core in the semiconductor memory device of FIG. 6.

FIG. 7 is a circuit diagram illustrating an example of memory core 600 in the semiconductor memory device of FIG. 6.

Referring to FIG. 7, memory core 600 comprises a first memory cell 610 coupled to bitline BL, a second memory cell 620 coupled to complementary bitline BLB, a first equalizer 640, a bitline sense amplifier 630, a column selection circuit 650, and an amplification controller. The amplification controller comprises a second equalizer 660, a PMOS transistor MP3 and an NMOS transistor MN13.

First memory cell 610 comprises an NMOS transistor MN1 and a cell capacitor CC1 that are coupled in series, and second memory cell 620 comprises an NMOS transistor MN2 and a cell capacitor CC2 that are coupled in series. Cell capacitors CC1 and CC2 each receive cell plate voltage VCP through one side. The drain and gate of NMOS transistor MN1 are coupled to bitline BL and a wordline WLi, respectively. The drain and gate of NMOS transistor MN2 are coupled to complementary bitline BLB and a wordline WLj, respectively.

First equalizer 640 comprises NMOS transistors MN5, MN6 and MN7. NMOS transistor MN5 is coupled between bitline BL and complementary bitline BLB and receives an equalization control signal PEQI through its gate. NMOS transistor MN6 has a drain coupled to bitline BL. NMOS transistor MN6 has a source that receives the bitline precharge voltage, and a gate that receives equalization control signal PEQI. First equalizer 640 precharges bitline BL and complementary bitline BLB to bitline precharge voltage VBL.

Bitline sense amplifier 630 comprises PMOS transistors MP1 and MP2 that are coupled in series between bitline BL and complementary bitline BLB, and NMOS transistors MN3 and MN4 that are coupled in series between bitline BL and complementary bitline BLB. PMOS transistors MP1 and MP2 sense a voltage difference between bitline BL and complementary bitline BLB, and amplify the voltage difference using a supply voltage VDD. NMOS transistors MN2 and MN3 sense a voltage difference between bitline BL and complementary bitline BLB, and amplify the voltage difference using ground GND.

Column selection circuit 650 comprises NMOS transistors MN8 and MN9, which electrically connect bitline BL and complementary bitline BLB to local I/O lines LIO and LIOB, respectively, in response to a column selection signal CSL.

Second equalizer 660 of the amplification controller comprises NMOS transistors MN10, MN11, and MN12. Equalization control signal PEQI is provided to gates of NMOS transistors MN10, MN11 and MN12, and bitline precharge voltage VBL is applied to sources of NMOS transistors MN11 and MN12. Second equalizer 660 is coupled to respective drains of PMOS transistors MP1 and MP2 of bitline sense amplifier 630 through a first power supplying line LA, and is coupled to respective sources of NMOS transistors MN3 and MN4 through a second power supplying line LAB. Second equalizer 660 precharges first power supplying line LA and second power supplying line LAB to bitline precharge voltage VBL, in response to equalization control signal PEQI. Memory core 600 further comprises a PMOS transistor MP3 and an NMOS transistor MN13. PMOS transistor MP3 provides supply voltage VDD to bitline sense amplifier 630 through first power supplying line LA in response to a switch control signal LAPG. NMOS transistor MN13 provides ground GND to bitline sense amplifier 630 through second power supplying line LAB in response to a switch control signal LANG.

Where data is being sensed from cell capacitor CC1 through bitline BL, charges stored in a capacitor of bitline BL and in cell capacitor CC1 are shared (i.e., charge sharing). Similarly, charges stored in a capacitor of complementary bitline BLB and in cell capacitor CC2 are shared where data is being sensed from cell capacitor CC2 through complementary bitline BLB. Thus, bitline BL and complementary bitline BLB are needed to be precharged to efficiently sense data from memory cells 610 and 620.

Figure 8A:
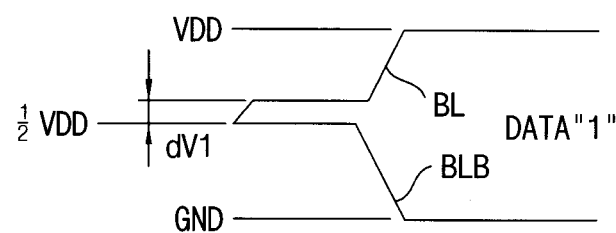
FIGS. 8A and 8B illustrate waveforms of a bitline and a complementary bitline according to data stored in a cell capacitor of a DRAM.
Figure 8B:
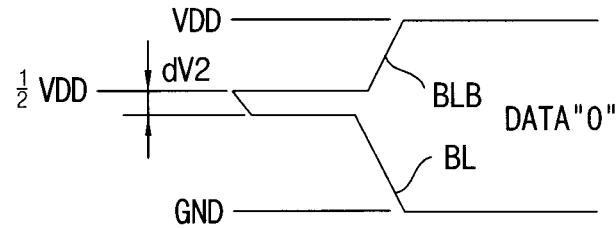

FIGS. 8A and 8B illustrate waveforms of a bitline and a complementary bitline where data "1" and "0" are stored in a cell capacitor, respectively.

Referring to FIG. 8A, bitline BL and complementary bitline BLB are precharged to bitline precharge voltage VBL. The level of bitline precharge voltage VBL can be, for example, half of power supply voltage ½ VDD. Then, where bitline sense amplifier 630 of FIG. 7 detects data "1", the voltage level of bitline BL is increased by an increment dV1 from the level of bitline precharge voltage VBL. Thereafter, bitline sense amplifier 630 amplifies bitline BL and complementary bitline BLB into levels of power supply voltage VDD and ground GND, respectively.

Referring to FIG. 8B, bitline BL and complementary bitline BLB are precharged to bitline precharge voltage VBL. Then, where bitline sense amplifier 630 of FIG. 7 detects data "0", the voltage level of bitline BL is decreased by a decrement dV2 from level of bitline precharge voltage VBL. Thereafter, bitline sense amplifier 630 amplifies bitline BL and complementary bitline BLB into levels of ground GND and power supply voltage VDD, respectively.

In the examples of FIG. 8, bitline precharge voltage VBL is applied by bitline precharge voltage generator 10 of FIG. 1. The distribution of bitline precharge voltage VBL that is on the dead zone is adjusted by leakage trimming unit 200 and fuse unit 120 so that voltage increment dV1 and voltage decrement dV2 each other have a similar voltage difference. Thus, amount of shared charges is substantially the same for sensing data "0" or data "1".

Figure 9:
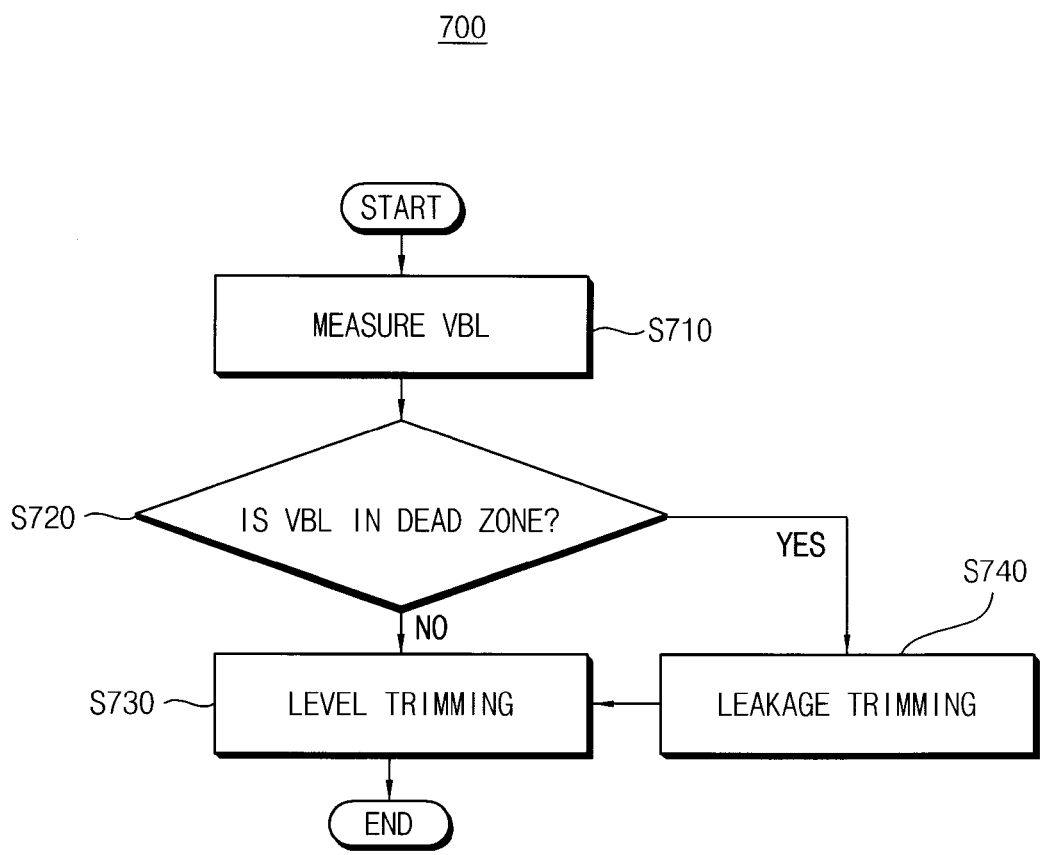
FIG. 9 is a flowchart illustrating a method of trimming a bitline precharge voltage in a DRAM according to an embodiment of the inventive concept.

FIG. 9 is a flowchart illustrating a method of trimming bitline precharge voltage VBL according to an embodiment of the inventive concept. The method of FIG. 9 will be described with reference to FIGS. 1, 2, 3, 4, 5 and 9. In the description that follows, example method steps are indicated by parentheses.

The method of FIG. 9 begins by measuring the level of bitline precharge voltage VBL that is applied to output node NO (S710). The level of bitline precharge voltage VBL can be measured by monitoring unit 300 of FIG. 1 or an external measuring device, such as a test device. As described with reference to FIGS. 8A and 8B, bitline BL and complementary bitline BLB of a memory device can be precharged based on bitline precharge voltage VBL.

Next, the method determines whether bitline precharge voltage VBL is in a dead zone (S720) based on a distribution of the level measured in S710. This determination can be performed by analyzing measurements such as those shown in the graph of FIG. 5.

Based on the determination, bitline precharge voltage VBL is set to a target voltage, such as half of supply voltage VDD/2, by level trimming (S730) or leakage trimming (S740). Where the measured level is out of the dead zone of bitline precharge voltage VBL (S720=NO), bitline precharge voltage VBL is set to the target voltage by level trimming using a plurality of fuses (S730) such as those in fuse unit 120 of FIG. 2. Where the measured level is in the dead zone of bitline precharge voltage VBL (S720=YES), bitline precharge voltage VBL is placed near an edge of the dead zone by leakage trimming, which applies the leakage current to output node NO (S740) as described with reference to FIGS. 4A, 4B and 4C and then bitline precharge voltage VBL is set to the target voltage level by level trimming using the fuses (S730) such as the fuse unit 120 of FIG. 2.

In some embodiments, the method of trimming bitline precharge voltage VBL of FIG. 9 is adapted for reducing a deviation of bitline precharge voltages VBL of a plurality of dies at a wafer level.

Figure 10:
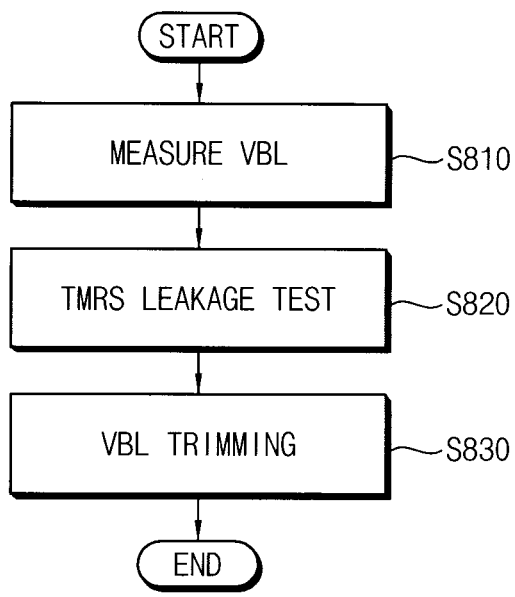
FIG. 10 is a flowchart illustrating a method of reducing deviations of bitline precharge voltages in a plurality of dies at a wafer level according to an embodiment of the inventive concept.

FIG. 10 is a flowchart illustrating a method of reducing deviations of bitline precharge voltages VBL in a plurality of dies at a wafer level according to an embodiment of the inventive concept.

Referring to FIG. 10, the method begins by measuring the bitline precharge voltages of the plurality of dies (S810). Thereafter, a leakage test is performed on the plurality of dies using a test mode register set TMRS (S820). Then, the bitline precharge voltage VBL of each of the plurality of the dies is trimmed selectively using a leakage current according to a result of the leakage test (S830). For example, based on a result of the leakage test, the level trimming operation S730 of FIG. 9 can be performed on dies that have leakage currents, while the leakage trimming operation S740 is not performed on such dies. Alternatively, both of the level trimming operation S730 and the leakage trimming operation S740 of FIG. 9 can be sequentially performed on dies that have substantially no leakage currents according to the result of the leakage test.

Figure 11A:
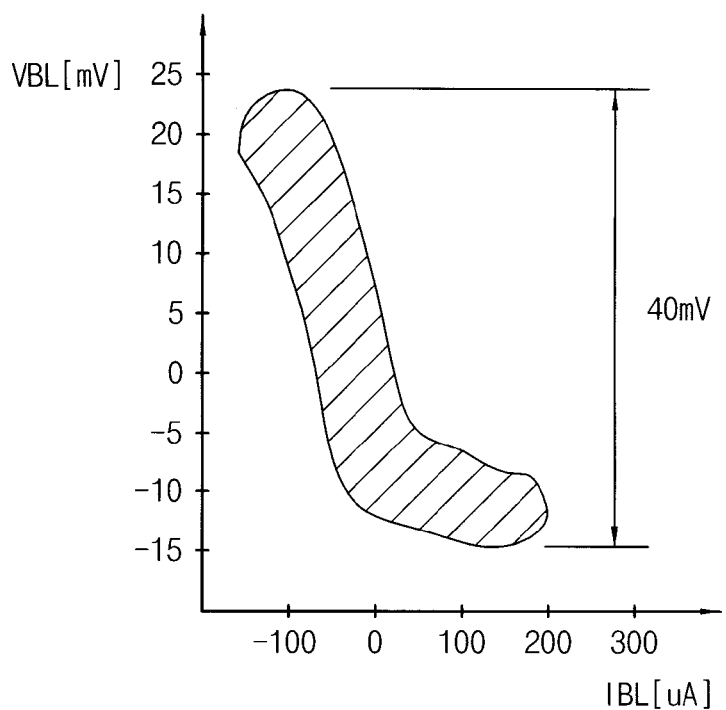
FIGS. 11A and 11B are graphs illustrating an effect of the method of FIG. 10.
Figure 11B:
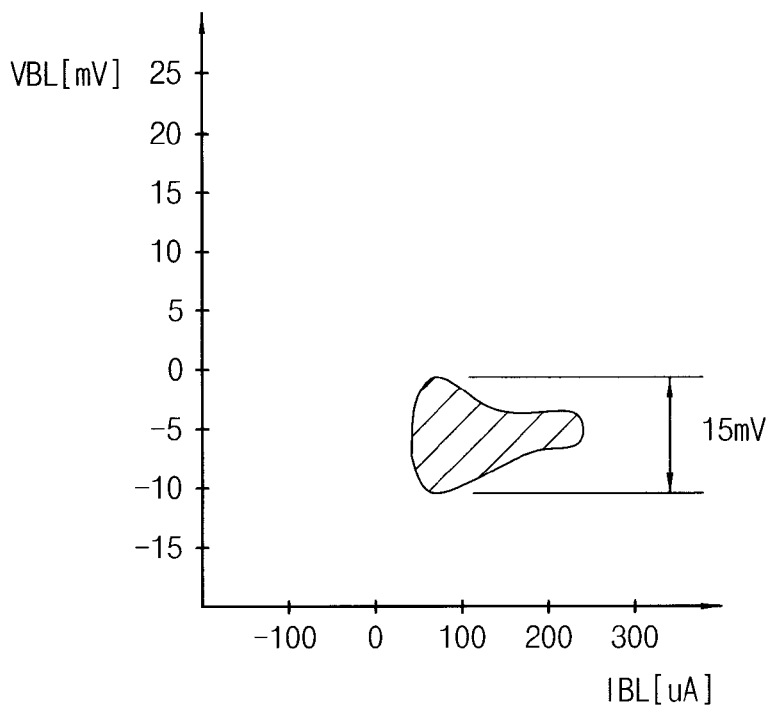

FIGS. 11A and 11B are graphs illustrating an effect of the method of FIG. 10. In particular, FIG. 11A illustrates a distribution of bitline precharge voltages VBL of a plurality of dies at a wafer level where each die has substantially no leakage current ILK, and FIG. 11B illustrates a distribution of bitline precharge voltages VBL of a plurality of dies at a wafer level where trimming operations such as level trimming S730 and/or leakage trimming S740 of FIG. 9 are performed on bitline precharge voltage VBL.

Referring to FIG. 11A, the bitline precharge voltages VBL of the plurality of the dies have about 40 mV of deviation and almost all of the bitline precharge voltages VBL of the plurality of the dies are in the dead zone. However, after the trimming operation S830 of FIG. 10 is performed on the plurality of dies, the deviation of the bitline precharge voltages VBL of the plurality of the dies is reduced to about 15 mV. After the deviation of the bitline precharge voltages VBL is reduced, the bitline precharge voltages VBL are adjusted to a target voltage level to be used to precharge bitlines and complementary bitlines of a memory core. These adjustments are intended to ensure that shared charges are secured for driving the bitlines and the complementary bitlines when data, such as data "0" or data "1", is sensed from a memory cell.

As indicated by the foregoing, various devices and methods can apply a leakage current to an output node to place a bitline precharge voltage at an edge of a dead zone, trim a level of the bitline precharge voltage using fuses, and reduce deviation of the bitline precharge voltage. Some of the methods can be adopted at a wafer level or at a package level, according to physical or electrical structures of the fuses, and/or methods of implementing the trimming.

The described embodiments can be employed in various types of memory systems that have distributions of bitline precharge voltages, such as DRAMs (including DDR and SDRAM) and other memory systems. Additionally, aspects of the disclosed embodiments can be used in microprocessor systems, digital signal processors, communication system processors, embedded memory systems, and a variety of systems that use enable or disable signals.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A bitline precharge voltage generator, comprising:
   a bitline precharge voltage providing unit configured to output a bitline precharge voltage to an output node and further configured to set the bitline precharge voltage to a target level; and
   a leakage trimming unit configured to apply a leakage current to the output node to place the bitline precharge voltage at an edge of a dead zone.

2. The bitline precharge voltage generator of claim 1, wherein the bitline precharge voltage providing unit comprises:
   a voltage dividing unit that outputs a first reference voltage through a first node and outputs a second reference voltage through a second node, wherein the first node and the second node are located between a third node connected to a first supply voltage, and a fourth node connected to ground, the voltage dividing unit comprising a plurality of resistors;
   an amplifying unit configured to output a first driving control signal and a second driving control signal based on the first reference voltage, the second reference voltage, and the bitline precharge voltage;
   a driving unit configured to drive the output node to the bitline precharge voltage in response to the first driving control signal and the second driving control signal; and
   a fuse unit connected to the voltage dividing unit and configured to set the bitline precharge voltage to the target level by adjusting the first reference voltage and the second reference voltage using a plurality of fuses.

3. The bitline precharge voltage generator of claim 2, wherein the amplifying unit comprises:
   a first amplifier connected between a second supply voltage and ground, and configured to amplify a voltage difference between the second reference voltage and the bitline precharge voltage to generate the first driving control signal; and a second amplifier connected between the second supply voltage and ground, and configured to amplify a voltage difference between the first reference voltage and the bitline precharge voltage to generate the second driving control signal.

4. The bitline precharge voltage generator of claim 2, wherein the driving unit comprises:

a first transistor connected between the second supply voltage and the output node, and configured to pull up the output node in response to the first driving control signal; and a second transistor connected between the second supply voltage and the output node, and configured to pull down the output node in response to the second driving control signal.

5. The bitline precharge voltage generator of claim 1, wherein the leakage trimming unit comprises at least one leakage element configured to apply the leakage current to the output node in response to at least one leakage control signal.

6. The bitline precharge voltage generator of claim 5, wherein the at least one leakage control signal comprises a first leakage control signal and a second leakage control signal, and wherein the leakage trimming unit comprises:

a first leakage element connected between a third supply voltage and a leakage node coupled to the output node, and configured to apply a positive leakage current to the output node in response to the first leakage control signal; and a second leakage element connected between the ground voltage and the leakage node, and configured to apply a negative leakage current to the output node in response to the second leakage control signal.

7. The bitline precharge voltage generator of claim 5, wherein the leakage trimming unit comprises a leakage element connected between a third supply voltage and a leakage node coupled to the output node, and configured to apply a positive leakage current to the output node in response to the at least one leakage control signal.

8. The bitline precharge voltage generator of claim 5, wherein the leakage trimming unit comprises a leakage element connected between the ground voltage and a leakage node coupled to the output node, and configured to apply a negative leakage current to the output node in response to the at least one leakage control signal.

9. The bitline precharge voltage generator of claim 1, wherein the bitline precharge voltage generator further comprises a monitoring unit coupled to the output node, and configured to monitor the level of the bitline precharge voltage.

10. The bitline precharge voltage generator of claim 9, wherein the monitoring unit determines whether the monitored bitline precharge voltage is in the dead zone, and selectively activates or deactivates the leakage trimming unit based on the determination.

11. A memory device, comprising:

a memory core configured to precharge a bitline and a complementary bitline according to a bitline precharge voltage, and configured to amplify a voltage difference between the bitline and the complementary bitline and apply the amplified voltage difference to a local input/output (I/O) line pair;

a local sense amplifier configured to amplify voltage signals of the local I/O line pair and apply the amplified voltage signals to a global I/O line pair;

an I/O sense amplifier configured to amplify voltage signals of the global I/O line pair;

an I/O buffer configured to buffer input data and an output signal of the I/O sense amplifier and to output the buffered output signal; and a voltage generator comprising a bitline precharge voltage generator configured to generate the bitline precharge voltage, wherein a distribution of the bitline precharge voltage has a dead zone, and wherein the bitline precharge voltage generator comprises a leakage trimming unit configured to apply a leakage current to an output node to place the bitline precharge voltage at an edge of the dead zone, wherein the bitline precharge voltage is apparent on the output node, and a bitline precharge voltage providing unit configured to output the bitline precharge voltage and to set the bitline precharge voltage to a target level.

12. The memory device of claim 11, wherein the memory core comprises:

a first memory cell coupled to the bitline;

a second memory cell coupled to the complementary bitline;

an equalizer configured to precharge the bitline and the complementary bitline according to the bitline precharge voltage;

a bitline sense amplifier configured to amplify the voltage difference between the bitline and the complementary bitline; and a column selection circuit configured to electrically connect each of the bitline and the complementary bitline to the local I/O line pair in response to a column selection signal.

13. The memory device of claim 11, wherein the memory core comprises dynamic random access memory (DRAM) cells.

14. The memory device of claim 11, wherein the bitline precharge voltage providing unit comprises:

a voltage dividing unit that outputs a first reference voltage through a first node and outputs a second reference voltage through a second node, wherein the first node and the second node are located between a third node connected to a first supply voltage, and a fourth node connected to ground, the voltage dividing unit comprising a plurality of resistors;

an amplifying unit configured to output a first driving control signal and a second driving control signal based on the first reference voltage, the second reference voltage, and the bitline precharge voltage;

a driving unit configured to drive the output node to the bitline precharge voltage in response to the first driving control signal and the second driving control signal; and a fuse unit connected to the voltage dividing unit and configured to set the bitline precharge voltage to the target level by adjusting the first reference voltage and the second reference voltage using a plurality of fuses.

15. A method of trimming a bitline precharge voltage that is used to precharge a bitline and a complementary bitline, the method comprising:

measuring a level of the bitline precharge voltage;

determining whether the bitline precharge voltage is in a dead zone, based on a distribution of the measured level; and setting the bitline precharge voltage to a target voltage using a leakage current based on the determination.

16. The method of claim 15, wherein, where the measured level is determined to be out of the dead zone of the bitline precharge voltage, setting the bitline precharge voltage comprises setting the bitline precharge voltage to the target voltage using a plurality of fuses.

17. The method of claim 15, wherein, where the measured level is in the dead zone of the bitline precharge voltage, setting the bitline precharge voltage comprises placing the bitline precharge voltage near an edge of the dead zone using the leakage current; and setting the bitline precharge voltage to the target voltage level.

18. The method of claim 16, wherein setting the bitline precharge voltage to the target voltage using a plurality of fuses comprises selectively cutting the fuses.

19. The method of claim 16, wherein the fuses are laser fuses or electrical fuses.

* * * * *